(12) United States Patent
Kawato

(10) Patent No.: US 6,906,898 B2
(45) Date of Patent: *Jun. 14, 2005

(54) DIFFERENTIAL DETECTION READ SENSOR, THIN FILM HEAD FOR PERPENDICULAR MAGNETIC RECORDING AND PERPENDICULAR MAGNETIC RECORDING APPARATUS

(75) Inventor: Yoshiaki Kawato, Tokyo (JP)

(73) Assignee: Hitachi Global Storage Technologies Japan, Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/674,416

(22) Filed: Oct. 1, 2003

(65) Prior Publication Data

US 2004/0061978 A1 Apr. 1, 2004

Related U.S. Application Data

(63) Continuation of application No. 09/941,795, filed on Aug. 30, 2001, now Pat. No. 6,657,823.

(30) Foreign Application Priority Data

Dec. 14, 2000 (JP) ........................................ 2000-380153

(51) Int. Cl.⁷ ................................................ G11B 5/39
(52) U.S. Cl. ....................................................... 360/314
(58) Field of Search ................................ 360/314, 315, 360/317, 324.1, 324.11, 324.12, 324.2

(56) References Cited

U.S. PATENT DOCUMENTS

| | | | |
|---|---|---|---|
| 5,859,753 A | 1/1999 | Ohtsuka et al. | |
| 6,128,166 A | 10/2000 | Tanaka et al. | |
| 6,185,079 B1 | 2/2001 | Gill | |
| 6,275,363 B1 * | 8/2001 | Gill | 360/324.2 |
| 6,392,849 B2 | 5/2002 | Maruyama et al. | |
| 6,462,917 B2 | 10/2002 | Terunuma et al. | |
| 6,469,926 B1 | 10/2002 | Chen | |
| 6,657,823 B2 * | 12/2003 | Kawato | 360/314 |
| 6,680,827 B2 * | 1/2004 | Li et al. | 360/314 |

FOREIGN PATENT DOCUMENTS

| | | |
|---|---|---|
| JP | 10-334422 | 5/1997 |
| JP | 2002-163807 | 10/2001 |
| WO | WO 97/44781 | 5/1997 |

OTHER PUBLICATIONS

Shun–ichi Iwasaki, "Perpendicular Magnetic Recording—Evolution and future", IEEE Transactions on Magnetics, vol. Mag–20, No. 5, Sep. 1984, pp. 657–662.

R.S. Indeck, J. H. Judy and S. Iwasaki, "A Magnetoresistive Gradiometer", IEEE Transactions on Magnetics, vol. 24, No. 6, Nov. 1988, pp. 2617–2619.

H.S. Gill, V.W. Hesterman, G.J. Tarnopolsky and L. T. Tran, P.D. Frank, H. Hamilton, A Magnetoresistive Gradiometer for Detection of Perpendicularly Recorded Magnetic Transitions:, J. Appl. Phys. 65 (1), Jan. 1, 1989, pp. 402–404.

* cited by examiner

*Primary Examiner*—David L. Ometz
(74) *Attorney, Agent, or Firm*—Reed Smith LLP; Stanley P. Fisher, Esq.; Juan Carlos A. Marquez, Esq.

(57) ABSTRACT

An object of the present invention is to produce a differential detection read sensor for perpendicular magnetic recording using two magnetic resistance elements; and to provide a thin film head for perpendicular recording using the read sensor and a magnetic recording apparatus having high recording density equipped with the head. The object of the present invention can be achieved by a reproducing sensor comprising a pair of magnetic resistance layers; a non-magnetic conductive layer; a pair of conductive layers; and a pair of magnetic shields.

10 Claims, 13 Drawing Sheets

FIG. 1

Prior Art

FIG. 2

Prior Art

FIG. 3

Prior Art

FIG. 4

Prior Art

FIG. 5

Prior Art

DIFFERENTIAL DETECTION READ SENSOR, THIN FILM HEAD FOR PERPENDICULAR MAGNETIC RECORDING AND PERPENDICULAR MAGNETIC RECORDING APPARATUS

This application is a Continuation application of U.S. application Ser. No. 09/941,795 filed on Aug. 30, 2001 now U.S. Pat. No. 6,657,823. Priority is claimed based upon U.S. application Ser. No. 09/941,795 filed on Aug. 30, 2001, which claims the priority date of Japanese application 2000-380153 filed on Dec. 14, 2000.

BACKGROUND OF THE INVENTION

1. Field of the Invention

The present invention relates to a differential detection read sensor for perpendicular magnetic recording suitable for high-density magnetic recording, a thin film head for perpendicular recording using the same and a magnetic recording apparatus using the head.

2. Description of the Related Art

As personal computers and workstations have been widespread rapidly, magnetic disk units as magnetic recording apparatuses forming the core of a nonvolatile file system have been required to increase the capacity quickly than ever. Increase of the capacity of the magnetic disk unit basically enhances a recording bit density, i.e., areal recording density.

The recording system in magnetic disk units currently commercially used is generally called an longitudinal recording method. This is a system in which a ferromagnetic film with high coercive force in the direction in parallel with a disk substrate surface is used as a recording medium, and then, the recording medium is magnetized in the substrate longitudinal direction so as to record information. In this case, a magnetization reversal part in which in-plane magnetizations are opposite to each other at a 180 angle corresponds to bit 1. To increase the areal recording density, it is necessary to increase the bit density in the disk circumferential direction (linear recording density) and the bit density in the disk radius direction (track density). The track density is currently limited by the forming process of geometrical track width and accuracy of head following of a recording/reproducing head. These are thus considered to be mainly the problems of processing and control system techniques. On the contrary, the linear recording density is thought to be limited in principle in that in light of the fact that the recording medium is an aggregate of ferromagnetic material crystalline particles, the linear recording density is associated with the magnetic stability of the aggregate. In the longitudinal recording system, magnetizations are opposite to each other around the magnetization reversal. A large inner magnetic field called a demagnetizing field in the direction to reduce the magnetization is generated around the magnetization reversal. The demagnetizing field forms, in the magnetization reversal part, a transition region with a finite width, that is, a region in which magnetization does not reach a sufficient value. When the bit intervals are narrowed and the adjacent magnetization transition regions are interfered with each other, there arises the disadvantage that the position of the magnetization reversal is shifted substantially. To increase the linear recording density, there is required a construction such that the medium is magnetized by overcoming the demagnetizing field. More specifically, the coercive force of the medium must be improved and the thickness of the recording magnetic film must be reduced to suppress the demagnetizing field. For this reason, the linear recording density is strongly limited by the construction and the magnetic property of the medium. In a standard longitudinal magnetic recording system, the ratio of the linear recording density to the track density is desirably about 10 to 15. When a recording density of 100 Gb/in$^2$ is realized under the conditions, the bit interval in the circumferential direction is about 25 nm. When the necessary magnetic property of the medium in which the magnetization reversal width is below 25 nm is estimated by a simple model, the medium film thickness is below 15 nm and the coercive force is above 5 kOe.

When the coercive force exceeds 5 kOe, it is difficult to ensure the recording magnetic field enough to magnetize the medium. When the thickness of the Co alloy magnetic film is below 15 nm, the substantial volume of the medium crystalline particles is reduced. As compared with the magnetic anisotropic energy of the particles (i.e., the energy to stabilize the magnetization in the constant direction), the magnitude of the heat energy (i.e., the energy to disturb the magnetization) cannot be ignored. Thermal fluctuation of the magnetization is significant, so that there arises the problem of thermal signal loss in which the magnitude of the recording magnetization is reduced with time. To suppress the thermal signal loss, it is necessary to increase the coercive force or the volume of the crystalline particles. When the head magnetic field is limited as described above, the allowable coercive force has an upper limit. In addition, increase of the film thickness to increase the volume of crystalline particles means increase of the demagnetizing field. When attempting to ensure the crystalline particle volume of crystalline size in the longitudinal direction, the randomness of the magnetization distribution in the medium is large, resulting in increase of the medium noise. A sufficient signal S/N cannot be thus obtained. To realize the areal recording density exceeding 100 Gb/in$^2$ while resisting the thermal signal loss and reducing the noise in the areal magnetic recording system, it is expected to be difficult in principle.

The perpendicular magnetic recording system is a system for forming the magnetization of a thin film medium so as to be perpendicular to the film surface, in which the recording principle is different from that of the prior art longitudinal magnetic recording medium. In other words, in the perpendicular magnetic recording system, since the adjacent magnetizations are not opposite to each other and are arranged in antiparallel, they are not affected by the demagnetizing filed. The magnetization transition region is expected to be very small to easily increase the linear recording density. The require to reduce the medium thickness is not as strong as that of the longitudinal recording. It is thus possible to ensure high resistance to the thermal signal loss. The perpendicular magnetic recording system is focused as a system essentially suitable for high-density magnetic recording. Various medium materials and constructions are proposed.

The perpendicular magnetic recording system has a system for employing a single-layer perpendicular magnetization film and a system for providing a soft magnetic underlayer adjacent to the disk substrate side of a perpendicular magnetization film. Using a two-layer perpendicular magnetic recording medium having a soft magnetic underlayer, there are considered the advantages: (1) a demagnetizing field generated on the surface of the recording layer can be reduced; and (2) the medium can be combined with a single pole type recording element to generate a large recording magnetic field having a steep distribution as compared with the ring head in the longitudinal recording. The technique is described in, for example, IEEE Transactions on Magnetics, Vol. MAG-20, No. 5, September 1984, pp. 657–662, Perpendicular Magnetic Recording—Evolution and Future. As the perpendicular magnetic recording medium of this system, there is studied a medium in which a perpendicular magnetization film made of a CoCr alloy is provided on a soft magnetic underlayer made of a soft magnetic film layer such as permalloy or Fe amorphous alloy.

Corresponding to a difference in the medium magnetization state between the longitudinal recording and the perpendicular recording, it is expected that the space distribution of a magnetic field applied from the medium to the reproducing sensor and the reproduced signal waveform of the perpendicular recording are different from those of the in-plane recording. Generally used as a reproducing sensor in the current longitudinal recording system is a so-called a shield type GMR (Giant Magnetoresistive) reproducing sensor. As shown in the upper part of FIG. 1, this is constructed such that one GMR reproducing element 12 is disposed between a pair of magnetic shields 11a and 11b made of soft magnetic materials. In the in-plane recording, a static magnetic field leaks from the reversal part of a medium magnetization 13. The GMR reproducing sensor senses the magnetic field and produces a Lorenzian waveform 17 as shown in the lower part of FIG. 1 as a reproducing signal. In this case, the pulse peak position corresponds to the reversal part.

Figure 2:
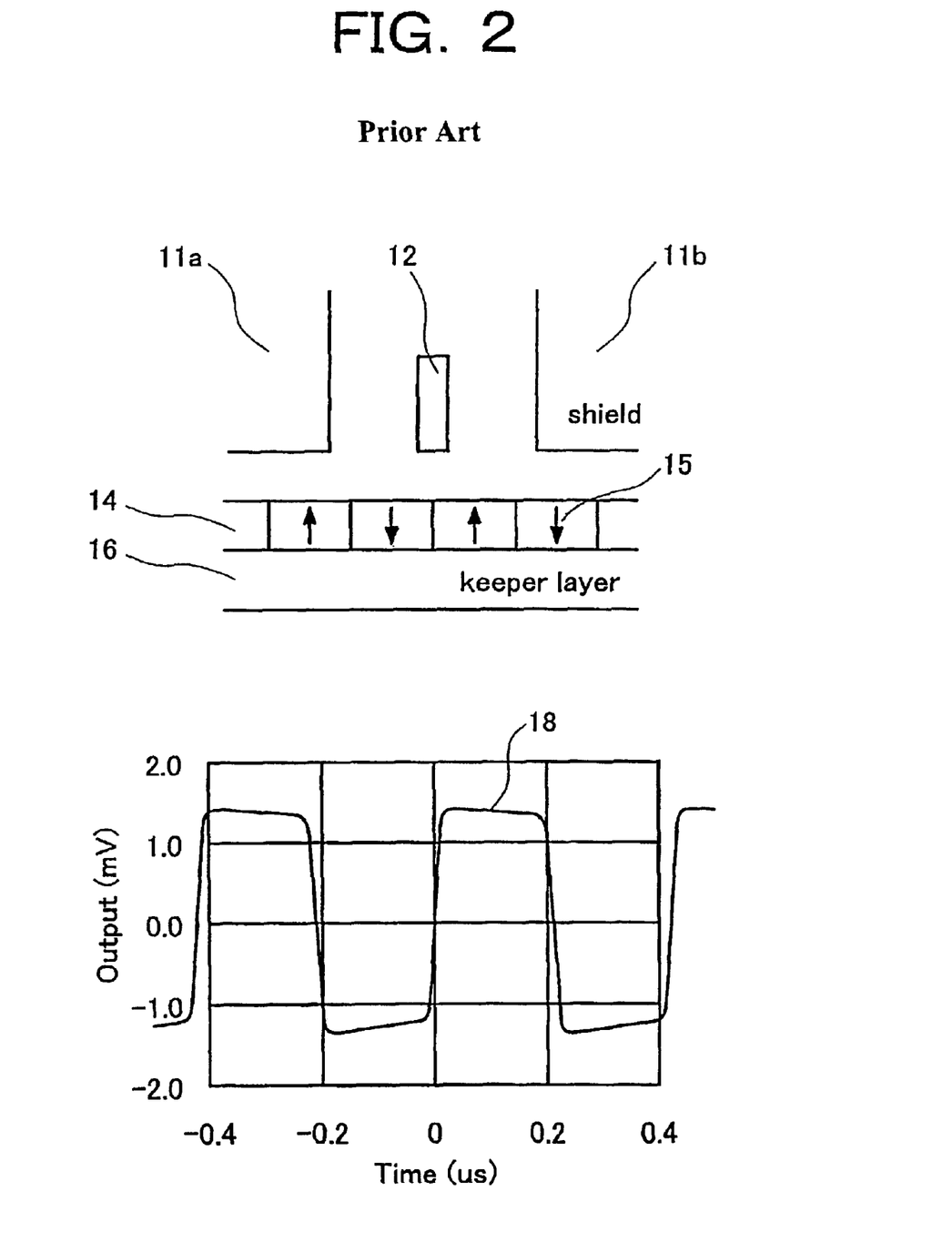
FIG. 2 upper part is a schematic cross-sectional view showing the arrangement of medium magnetization and a magnetic shield type GMR reproducing sensor in a perpendicular recording system, and FIG. 2 lower part is one example of a reproduced signal waveform obtained from the magnetic shield type GMR reproducing sensor in the perpendicular recording system.

The recording medium in the perpendicular recording has a recording layer 14 having perpendicular magnetic anisotropy and a soft magnetic underlayer 16 made of high-permeability ferromagnetic material, as shown in the upper part of FIG. 2. A medium magnetization 15 is arranged so as to be perpendicular to the medium surface. A static magnetic field is generated from a magnetization constant region between the reversal parts. The reproduced waveform from the GMR reproducing sensor at a low recording density is a step-like waveform 18, as shown in the lower part of FIG. 2. In this case, the zero-cross position of the step-like waveform corresponds to the reversal part.

Figure 1:
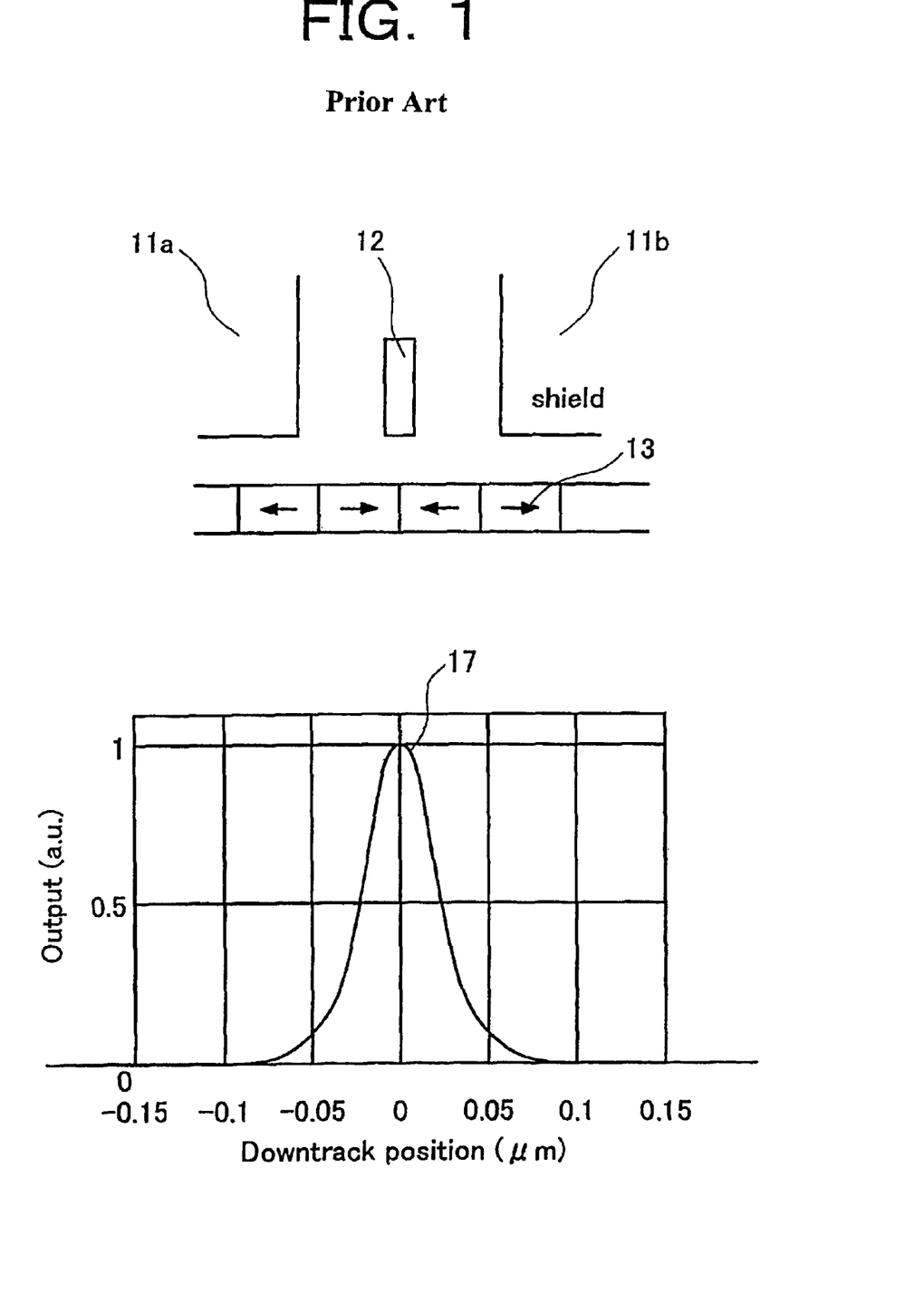
FIG. 1 upper part is a schematic cross-sectional view showing the arrangement of medium magnetization and a magnetic shield type GMR reproducing sensor in an in-plane recording system, and FIG. 1 lower part is one example of a reproduced signal waveform obtained from the magnetic shield type GMR reproducing sensor in the in-plane recording system.

A signal processing system for use in the current magnetic disk unit is assumed to be a one-peak type reproduced waveform as shown in the lower part of FIG. 1. In the system, decoding is impossible from the step-like reproduced waveform obtained from the system using the two-layer medium for perpendicular recording provided with a soft magnetic underlayer and the shield-type GMR reproducing sensor. To solve the problem, there are known the following three methods.

① Differential process for reproduced signal
② Change of a method for signal processing
③ Differential detection read sensor Method ① passes a reproduced signal outputted from the head to a differential circuit before processing the signal. Method ② changes the method for signal processing so as to be suitable for the reproduced signal waveform. Both of them must largely change LSI of a currently used electric circuit system. The system noise and head noise are increased, resulting in requiring great improvement in S/N to the reproducing head. In method ③, the waveform obtained from the reproducing sensor has already been a one-peak type, so that any modification is not required to the system side. Method ③ is the most realistic in view of constructing a small and inexpensive magnetic recording apparatus having large capacity.

Figure 3:
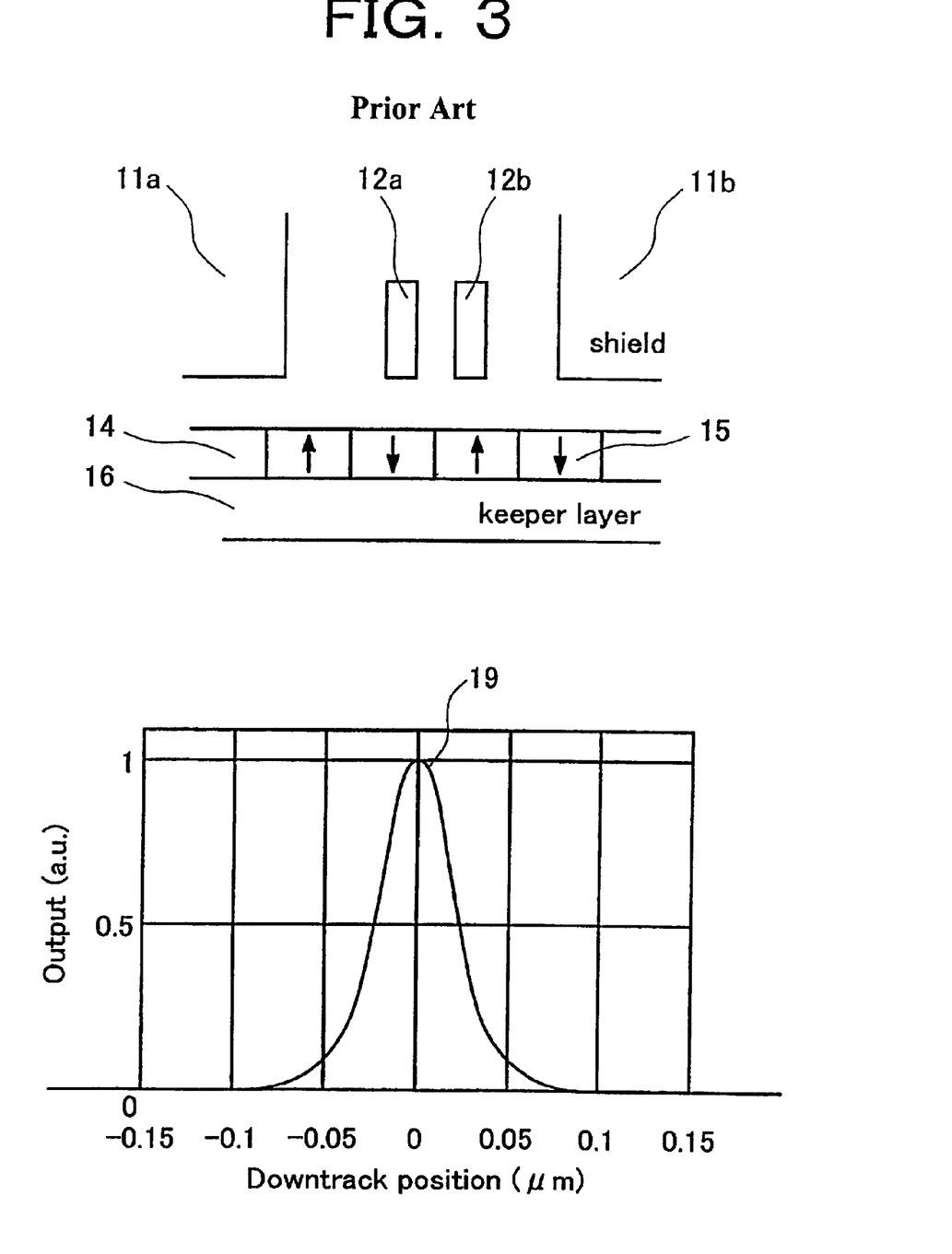
FIG. 3 upper part is a schematic cross-sectional view showing the arrangement of medium magnetization and a differential detection MR read sensor in the perpendicular recording system, and FIG. 3 lower part is one example of a reproduced signal waveform obtained from the differential detection MR read sensor in the perpendicular recording system.
Figure 4:
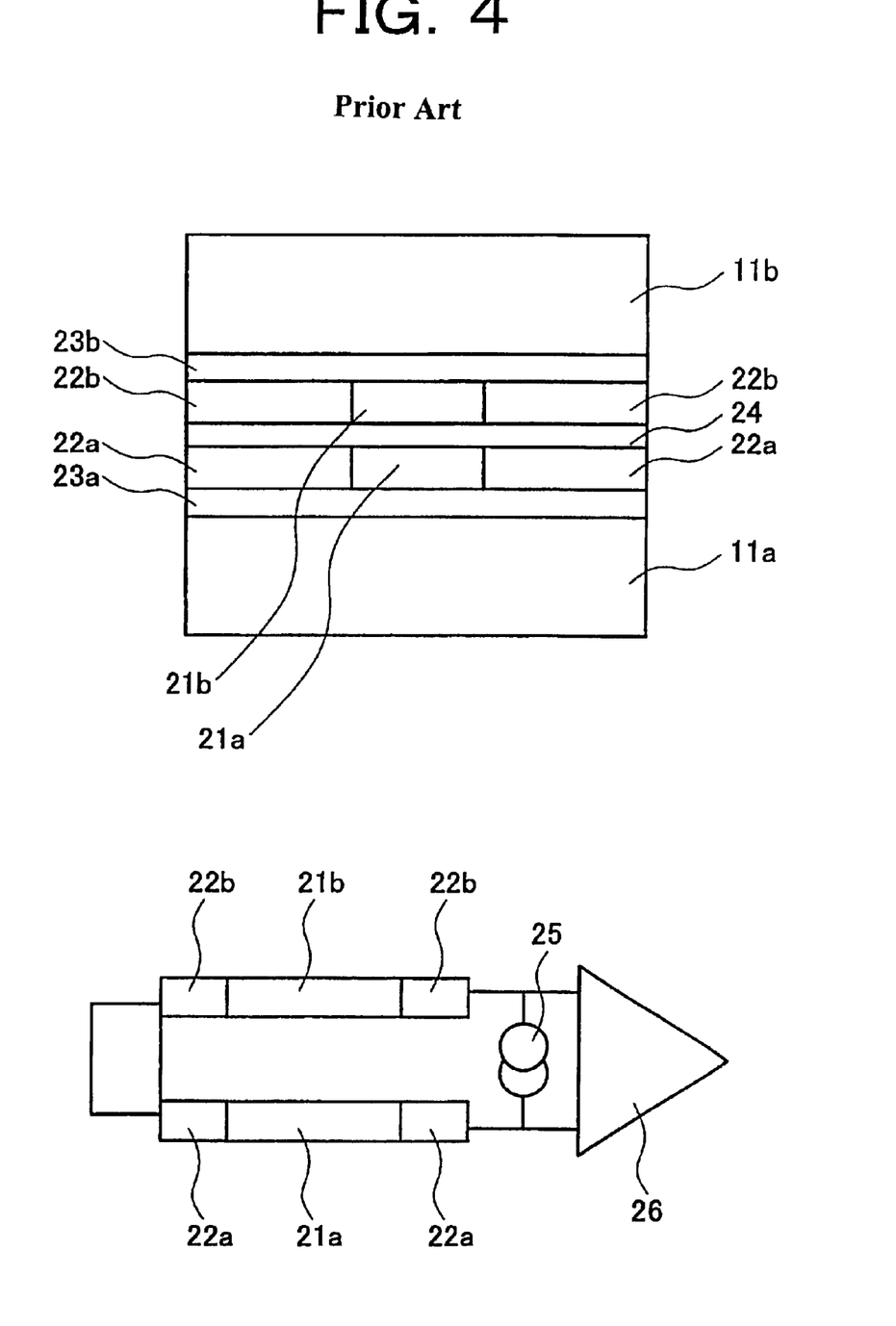
FIG. 4 upper part is a schematic view of a prior art differential detection MR read sensor viewed from the medium opposed surface, and FIG. 4 lower part is a schematic view showing the prior art differential detection MR read sensor when the respective elements and exterior circuit systems are electrically connected.

As specific means for constructing a differential detection read sensor corresponding to perpendicular recording, IEEE Transactions on Magnetics, vol. 24, p2617 (1988) and Journal of Applied Physics, vol. 65, p402 (1989) disclose a reproducing sensor and system in which a circuit system is constructed so that two anisotropic magnetic resistance (AMR) elements indicate a reverse polarity response to a magnetic field so as to fetch differential voltage of each of both elements as a reproduced signal. Such a construction is called Gradiometer and can obtain the same effect when the two AMR elements are replaced by two GMR elements. FIG. 3 shows a schematic view of Gradiometer and shows a reproduced waveform obtained using the same. Two magnetic resistance elements (MR elements) 112a and 112b are disposed between the magnetic shields 11a and 11b. Both magnetic resistance elements 112a and 112b are constructed so that a voltage change to the magnetic field is reversed; that is, when the magnetic field in the same direction is applied, one of the magnetic resistance elements increases the voltage, and the other decreases the voltage. The sum of signals outputted from the respective elements is equivalent to the sensing of the differential of the magnetic field in the positions of the MR elements 112a and 112b. There is thus obtained a one-peak type reproduced waveform as shown in the lower part of FIG. 3 almost equal to the differential waveform of the signal of the lower part of FIG. 2. The specific construction of the reproducing sensor is shown in the upper part of FIG. 4. First, there are formed a magnetic shield 11a, a lower insulating gap 23a, an MR element 21a, and an electrode 22a for flowing to this a sensing electric current (an electric current for sensing a resistance change as a voltage change). Then, an intermediate insulating gap 24 is deposited (this corresponds to the interval between the above-mentioned two elements). A second MR element 21b and electrode 22b are formed to finally deposit an upper insulating gap 23b and a magnetic shield 11b. The construction thus formed disposes the two MR elements are disposed between the magnetic shields to be thoroughly independent electrically from each other. In the magnetic recording apparatus, the two elements are connected in series, and then, both ends are connected to exterior circuit systems 25 and 26 for reproducing operation, as shown in the lower part of FIG. 4. In the above-mentioned known art, it is reported that a thus-constructed reproducing system combined with the perpendicular recording medium obtains a one-peak type reproduced waveform.

To manufacture a head for use in the known art, MR film deposition and MR element patterning process are repeated twice. In this case, increase of the manufacturing cost due to the increased number of the processes becomes a problem. The patterning process to define the track width is repeated twice. When shifting between the two elements 21a and 21b is caused (this corresponds to shifting in the right and left direction in the upper part of FIG. 4), crosstalk to read the adjacent track signal may be caused to significantly deteriorate the S/N ratio of the reproduced signal. When two MR elements are made into the gap between the magnetic shields reduced with increase of the recording density, the thickness of the insulating films between the MR elements and between the MR element and the magnetic shield (the lower insulating gap 23a, the upper insulating gap 23b, and the intermediate insulating gap 24) must be reduced. It is very difficult to thoroughly provide electric insulation in the known art.

Figure 5:
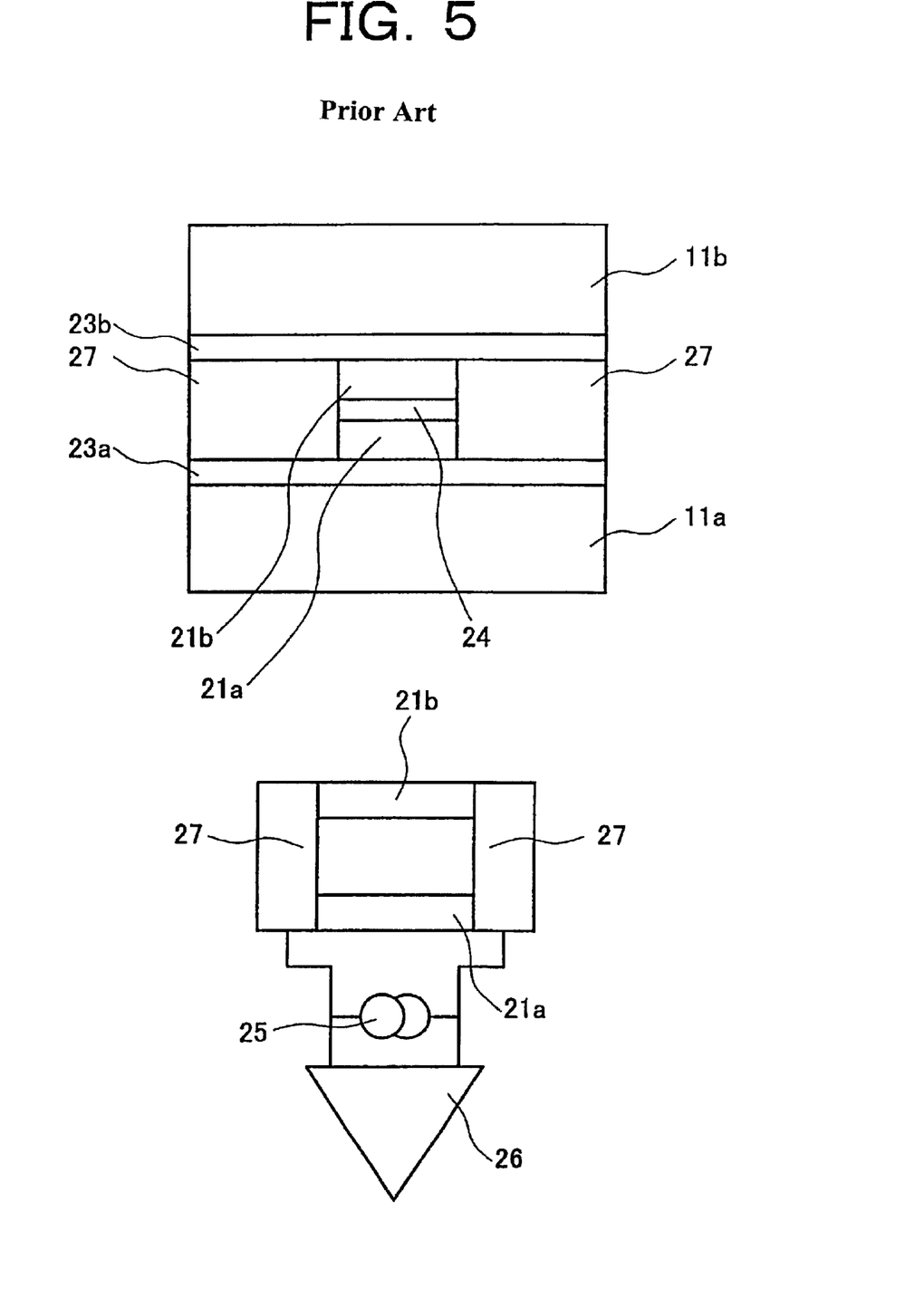
FIG. 5 upper part is a schematic view of a prior art differential detection MR read sensor viewed from the medium opposed surface, and FIG. 5 lower part is a schematic view showing the prior art differential detection MR read sensor when the respective elements and exterior circuit systems are electrically connected.

Japanese Published Unexamined Patent Application No. Hei 10-334422 discloses a technique for constructing a differential detection read sensor of another construction. As shown in the upper part of FIG. 5, in the head construction in this case, MR elements 21a and 21b are connected in parallel with a common electrode 27 and exterior circuit systems 25 and 26. When such a construction is employed, the patterning process of the MR element is required at least once. It is thus possible to avoid the problems of increase of the number of the processes indicated in the first prior art and of shifting between the elements. However, the problem of electric insulation in a lower gap layer 23a, an upper gap 23b and an intermediate insulating gap 24 between the two MR elements and the magnetic shields exists as in the first prior art.

In addition to the problem, both MR elements are connected in parallel to reduce the entire resistance change amount. Thus, only a very low reproducing sensitivity is expected, that is, there arises a new problem of significant reduction of the reproducing sensitivity. Specifically, when the resistance change amount of one MR element to the medium magnetic field is $\Delta R$, in the first known art, a resistance change of $2 \times \Delta R$ as the entire read sensor can be expected, while in the second prior art, it is $\Delta R/2$. The two MR elements must be electrically connected in series as the requirement of the differential detection read sensor.

SUMMARY OF THE INVENTION

There are realized a differential detection read sensor for perpendicular magnetic recording for high-density magnetic recording, a thin film head for perpendicular recording using the same, and a magnetic recording apparatus using the head. In particular, the read sensor requires a construction and process in which the respective MR elements can be prevented from being shifted in the track width direction, the number of steps of production line is not increased, if possible, as compared with the prior art magnetic shield type GMR reproducing sensor, and electric insulation is not required between the elements or between the element and the magnetic shield. To obtain a high reproduced output, the two MR elements must be electrically connected in series.

An object of the present invention is to provide in a differential detection read sensor for perpendicular magnetic recording using two magnetic resistance elements, which can prevent the respective magnetic resistance elements from being shifted in the track width direction and compensate an electric insulating state between the magnetic resistance elements or between the magnetic resistance element and the magnetic shield.

Another object of the present invention is to provide a differential detection read sensor which, in manufacturing a magnetic head having such a read sensor construction, has a read sensor construction not increasing the number of steps of production line as compared with that of the prior art magnetic shield type GMR reproducing sensor.

A further object of the present invention is to provide a thin film head for perpendicular recording equipped with the reproducing element and a single pole type recording element and a magnetic recording apparatus having high recording density equipped with the head and a perpendicular magnetic recording medium.

The object of the present invention can be achieved by a reproducing sensor comprising: a pair of magnetic resistance layers for changing electric resistance by a magnetic field; a non-magnetic conductive layer laminated so as to be interposed between the pair of magnetic resistance layers; a pair of conductive layers for flowing an electric current in the direction perpendicular to the film surface of the multi-layer construction; and a pair of magnetic shields for interposing therebetween the layers; wherein the pair of magnetic resistance layers are connected in series through the conductive layer.

The object of the present invention can be achieved by the reproducing sensor wherein each of the pair of magnetic resistance layers comprises one non-magnetic insulating layer; first and second ferromagnetic layers interposing therebetween the non-magnetic insulating layer; and an antiferromagnetic layer for fixing the magnetization of the second ferromagnetic layer in one direction at least during the reproducing operation.

The object of the present invention can be achieved by the reproducing sensor wherein in the electric resistance changes of the pair of magnetic resistance layers during the reproducing operation, one of the electric resistance changes is increased to a medium magnetic field in the same direction, and the other is decreased thereto.

The object of the present invention can be achieved by the reproducing sensor wherein in the pair of magnetic resistance layers each comprising a non-magnetic insulating layer, first and second ferromagnetic layers interposing therebetween the non-magnetic insulating layer, and an antiferromagnetic layer for fixing the magnetization of the second ferromagnetic layer in one direction at least during the reproducing operation, at least one of the second ferromagnetic layers is of a three-layer construction of the ferromagnetic material thin film/non-magnetic metal thin film/ferromagnetic material thin film, and the magnetizations of the ferromagnetic material thin film forming both ends of the three-layer construction are exchangably connected so as to be arranged in antiparallel with each other.

The object of the present invention can be achieved by the reproducing sensor wherein the non-magnetic metal thin film in each of the second ferromagnetic layers in the pair of magnetic resistance layers is any one of Ru, Rh and Ir.

The object of the present invention can be achieved by the reproducing sensor wherein at least one of the respective second ferromagnetic layers of the pair of magnetic resistance layers reverses the fixing direction of the magnetization by applying a predetermined magnetic field.

The object of the present invention can be achieved by the reproducing sensor wherein the pair of magnetic resistance layers are spin tunnel junction.

The object of the present invention can be achieved by the reproducing sensor wherein the non-magnetic layers in the pair of magnetic resistance layers are made of oxide aluminum.

The object of the present invention can be achieved by a thin film head for perpendicular magnetic recording comprising: a reproducing sensor comprising a pair of magnetic resistance layers for changing electric resistance by a magnetic field, a non-magnetic conductive layer laminated so as to be interposed between the pair of magnetic resistance layers, a pair of electrodes for flowing an electric current in the direction perpendicular to the film surface of the multi-layer construction, and a pair of magnetic shields for interposing therebetween the layers, wherein the pair of magnetic resistance layers are connected in series through the conductive layer; and a single pole type recording element.

The object of the present invention can be achieved by a magnetic recording apparatus comprising: a thin film head for perpendicular magnetic recording comprising a reading sensor comprising a pair of magnetic resistance layers for changing electric resistance by a magnetic field, a non-magnetic conductive layer laminated so as to be interposed between the pair of magnetic resistance layers, a pair of electrodes for flowing an electric current in the direction perpendicular to the film surface of the multi-layer construction, and a pair of magnetic shields for interposing therebetween the layers, wherein the pair of magnetic resistance layers are connected in series through the conductive layer, and a single pole type recording element; and a perpendicular magnetic recording medium provided with a perpendicular magnetization film through a soft magnetic underlayer on a non-magnetic substrate.

DETAILED DESCRIPTION OF THE PREFERRED EMBODIMENTS

Preferred embodiments of the present invention will be described hereinbelow with reference to the drawings.

Figure 6:
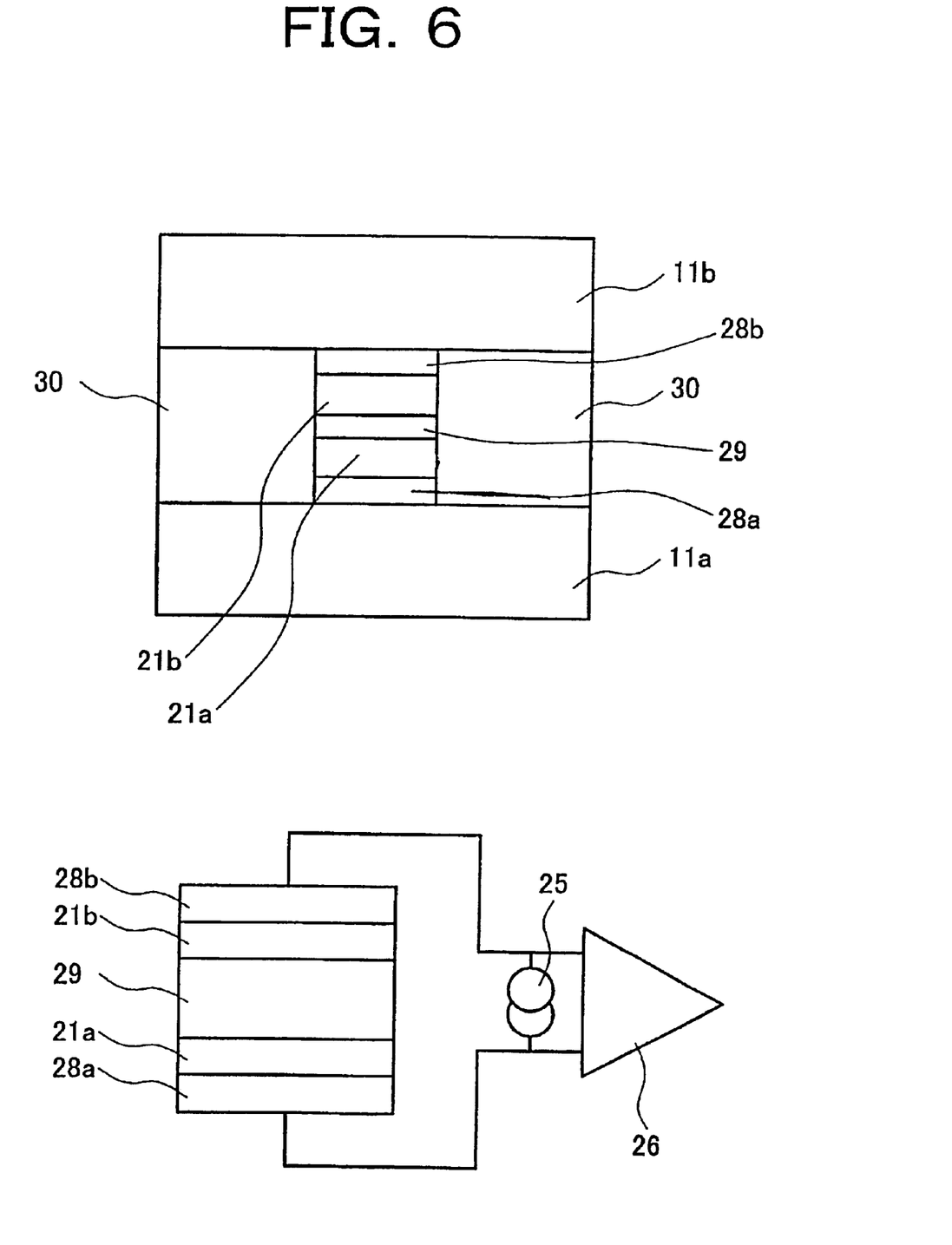
FIG. 6 upper part is a schematic view of a differential detection MR read sensor according to the present invention viewed from the medium opposed surface, and FIG. 6 lower part is a schematic view showing the differential detection MR read sensor according to the present invention when the respective elements and exterior circuit systems are electrically connected.

The basic construction of a reproducing sensor produced in the present invention is shown in FIG. 6. Magnetic resistance films for flowing a sensing electric current in the direction perpendicular to the film surface or the substrate surface such as TMR (Tunneling Magnetoresistivity) or CPP—GMR (Current Perpendicular to the Plane—GMR) is used as reproducing elements. The upper part of FIG. 6 is a schematic diagram of the reproducing sensor construction of the present invention. Reproducing elements 21a and 21b are laminated by interposing therebetween a conductive layer 29 to be electrically connected in series and are patterned together with almost the same width. A pair of electrodes 28a and 28b are provided on the top and bottom of the MR elements, which are connected through the pair of electrodes to the exterior circuit systems 25 and 26, as shown in the lower part of FIG. 6. As shown in the upper part of FIG. 6, the pair of electrodes 28a and 28b are contacted with magnetic shields 11a and 11b to serve as the magnetic gap. Insulation between the MR element and the shield is unnecessary.

[Embodiment 1]

Figure 7:
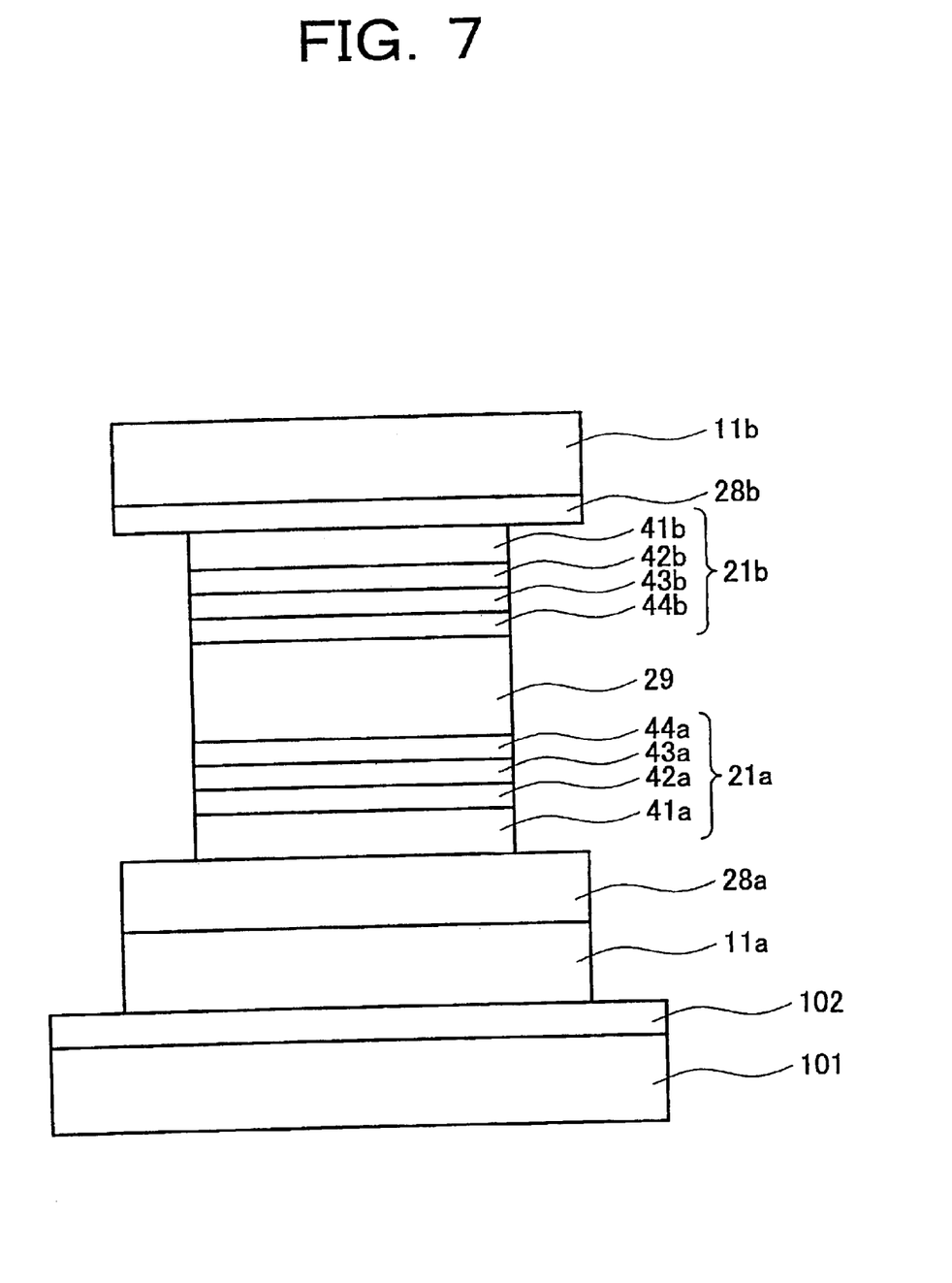
FIG. 7 is a schematic cross-sectional view showing a differential detection MR read sensor lamination construction of a first embodiment of the present invention.

FIG. 7 shows a cross-sectional view of a differential detection read sensor applying the present invention. Through a base coat alumina layer 102 having a thickness of 5 $\mu$m on a ceramics substrate 101, there are formed a magnetic shield 11a of Ni81Fe19 (3 $\mu$m), an electrode 28a of Ta (10 nm), a first MR element 21a, a conductive layer 29 of Ta (30 nm), a second MR element 21b, and a conductive layer (electrode) 28b of Ta (10 nm). Both MR elements are electrically connected in series by the conductive layer 29, and are connected through the pair of electrodes 28a and 28b provided on the top and bottom of the MR elements to the exterior circuit systems. In particular, there is shown a construction so that the electrodes 28a and 28b are contacted to the exterior circuits through the magnetic shields 11a and 11b. This construction is made for avoiding the problems of simplification of the production process and insulation. Connection not through the magnetic shields can obtain the same property.

Figure 8:
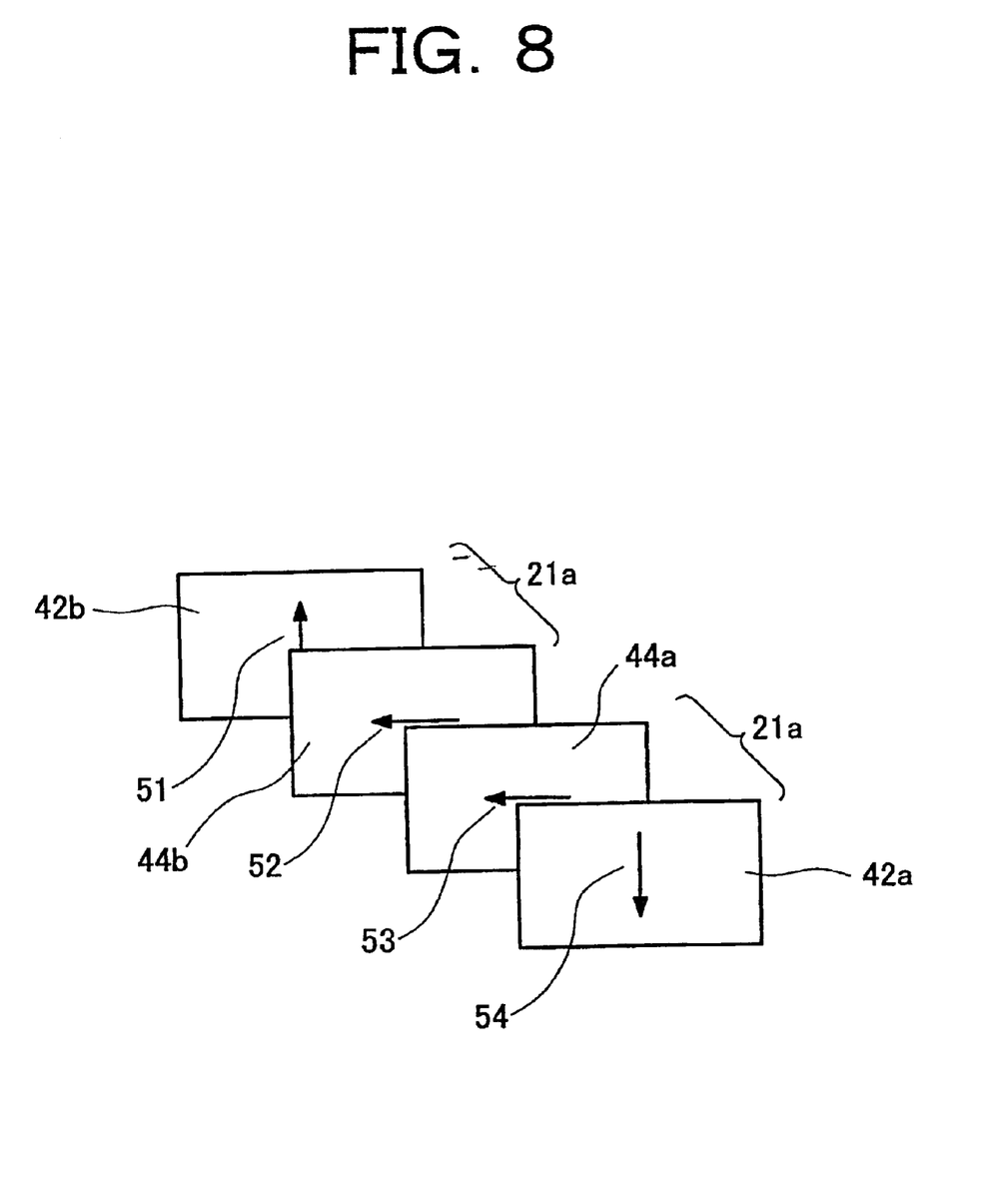
FIG. 8 is a magnetization state diagram of the respective ferromagnetic layers in the differential detection MR read sensor of the first embodiment of the present invention.

The MR element 21b has, from its underside, a ferromagnetic layer 44b made of Ni81Fe19 (3 nm)/Co90Fe10 (0.5 nm), a non-magnetic layer 43b made of oxide aluminum (0.8 nm), a ferromagnetic layer 42b made of Co90Fe10 (2 nm), and an antiferromagnetic layer 41b made of PtMn (12 nm). On the other hand, the MR element 21a laminates, from its underside, an antiferromagnetic layer 41a made of IrMn (10 nm), a ferromagnetic layer 42a made of Co90Fe10 (1.5 nm), a non-magnetic layer 43a made of oxide aluminum (1.0 nm), and a ferromagnetic layer 44a made of Co90Fe10 (0.5 nm)/Ni81Fe19 (3 nm). The oxide aluminum layer is prepared by depositing aluminum and introducing oxygen gas into the film depositing apparatus for oxidation. To perform differential detection, the magnetization directions of the ferromagnetic layers 42a and 42b (hereinafter, called a fixing layer) contacted with the antiferromagnetic layers 41a and 41b is arranged in antiparallel with each other in the respective MR elements. FIG. 8 shows the magnetization directions of the respective ferromagnetic layers. Magnetizations 52 and 53 of the ferromagnetic layers 44b and 44a

(hereinafter, called a free layer) not contacted with the antiferromagnetic layers are parallel and are directed in the track width direction (that is, the direction in parallel with the medium surface and perpendicular to the direction of the relative motion of the head—medium). In order that both are always in a single magnetic domain, an actually produced sensor is provided with means for applying one-direction bias magnetic field in the left side direction of FIG. 8. On the other hand, magnetizations 51 and 54 of the above-mentioned fixing layers are directed in the element height direction (that is, in the direction perpendicular to the medium surface), and both are antiparallel. To realize the magnetization arrangement of the fixing layers, the following heat treatment is performed in the magnetic field. While a magnetic field of 5 kOe is applied in the direction to direct the magnetization 51 of the fixing layer 42b (in the upward direction of FIG. 8), the atmosphere temperature is raised up to 250° C. The state is maintained for 3 hours. The atmosphere temperature is lowered to 230° C., and the direction of the magnetic field is reversed 180° to be directed to the magnetization 54 of the fixing layer 42a (in the downward direction of FIG. 8) to be maintained for one hour. Finally, the atmosphere temperature is lowered to room temperature. Through the processes as described above, it is possible to realize a construction so that the resistance of the respective MR elements is changed reversely from the magnetic filed in the same direction. In other words, for example, when the magnetic filed is applied upward in FIG. 8, the magnetizations 52 and 53 of the free layers 44b and 44a are rotated counterclockwise. At this time, since the relative angle of the magnetization of the fixing layer and the free layer is reduced, the resistance of the MR element 21b is decreased while the resistance of the MR element 21a is increased.

Figure 9:
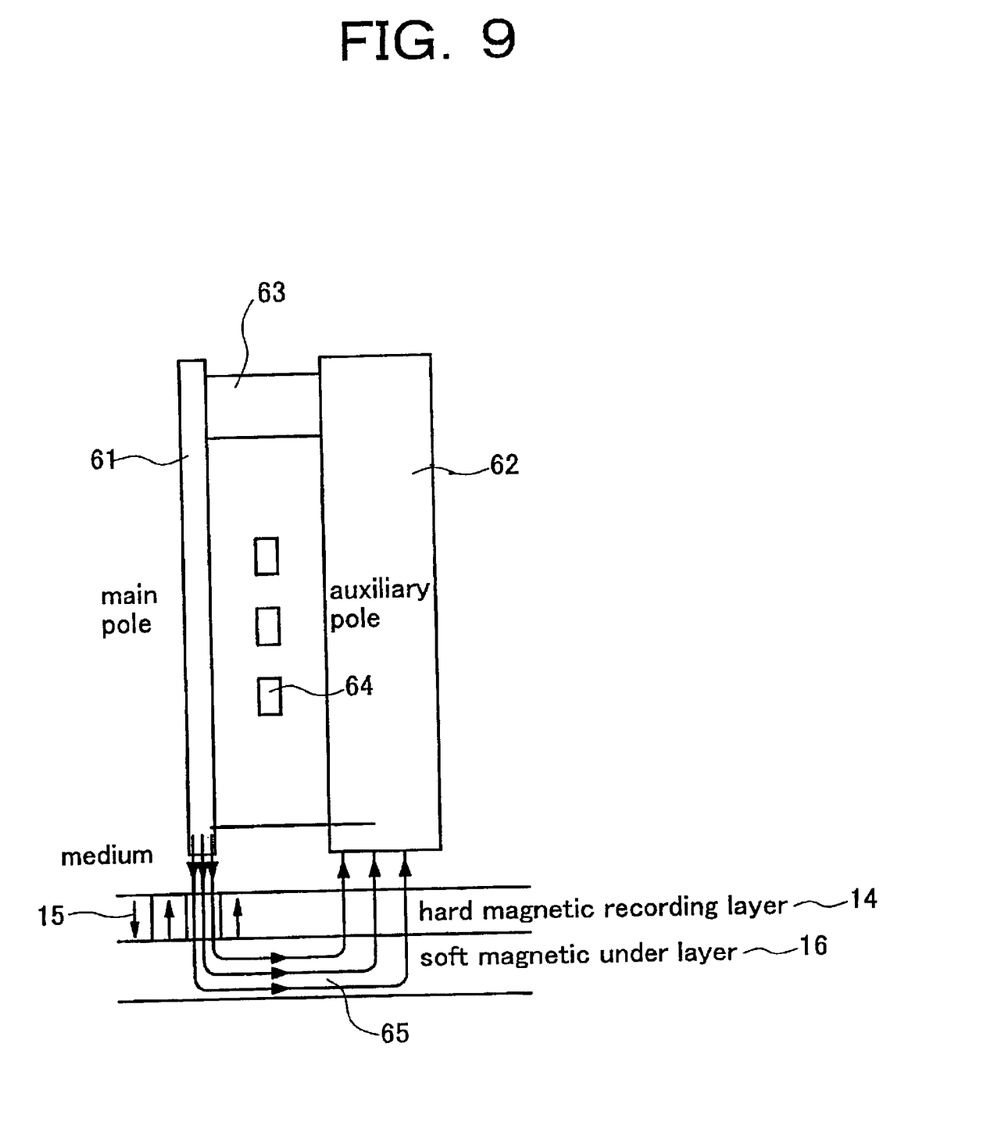
FIG. 9 is a schematic cross-sectional view of a single pole type recording element and a perpendicular magnetic recording medium.

To check the effect of differential reproduction, the perpendicular recording medium is combined with the single pole type recording element to construct a thin film head to check the reproducing property. FIG. 9 is a cross-sectional view of the single pole type recording element and the perpendicular recording medium used at this time. The single pole type recording element is provided with a main pole 61, an auxiliary pole 62, a high-permeability material 63 got magnetically connecting them, and an exciting coil 64. The single pole type recording element constructs a magnetic circuit together with a soft magnetic underlayer 16 made of a high-permeability ferromagnetic material disposed on the substrate side of a hard magnetic recording layer 14 having perpendicular magnetic anisotropy. Recording to the medium is done by a magnetic flux 65 flowing from the main pole 61 into the soft magnetic underlayer 16.

Figure 10:
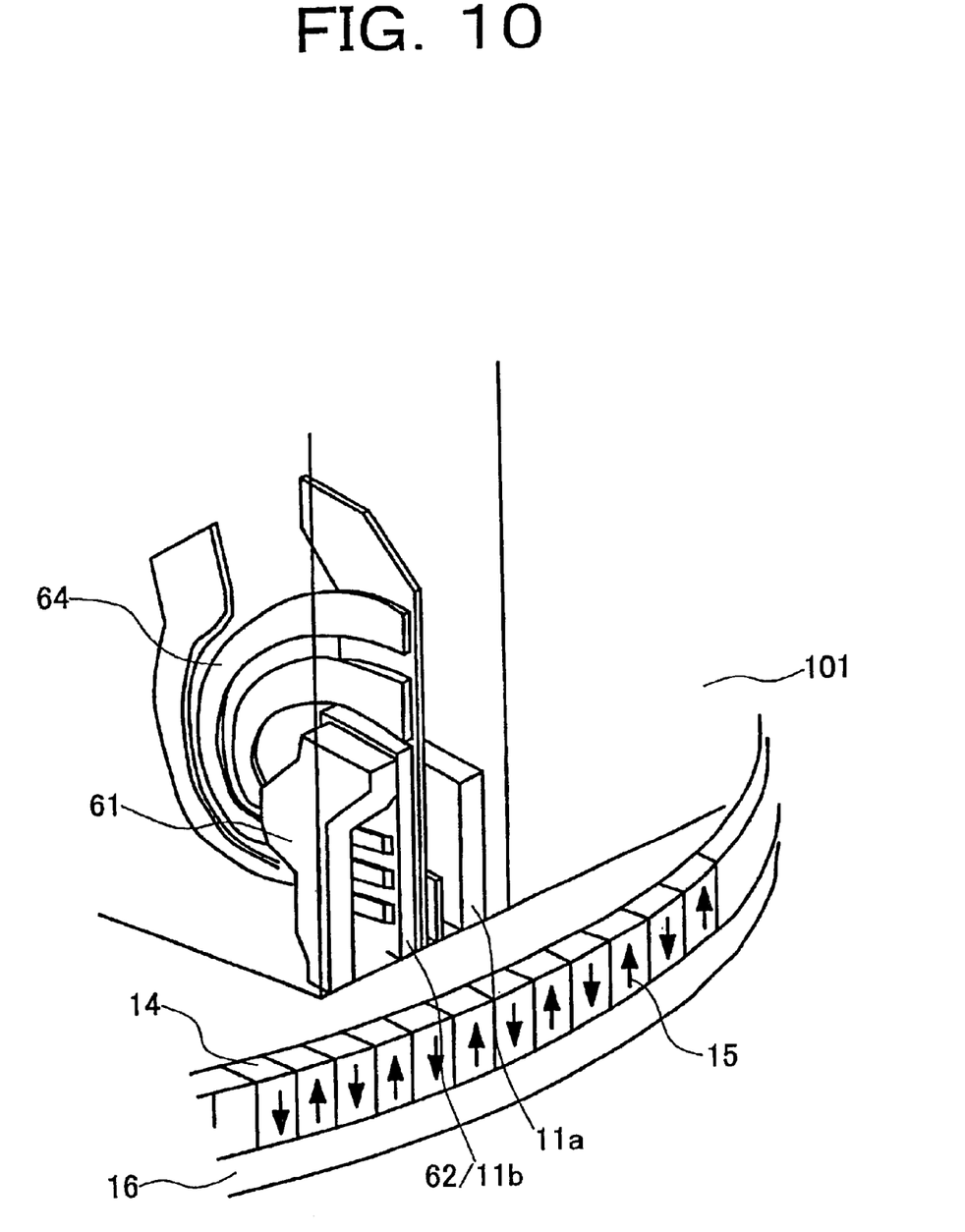
FIG. 10 is a schematic cross-sectional view of a thin film head equipped with the single pole type recording element and the reproducing sensor and the perpendicular magnetic recording medium.

FIG. 10 is a schematic diagram of a magnetic disk of this embodiment provided with a thin film head for perpendicular magnetic recording and a perpendicular magnetic recording medium. An element is formed on a slider 101 in the order of a reproducing sensor and a recording element. Using this, the magnetizations of the hard magnetic recording layer on the magnetic disk surface are alternate to form a recording track. The magnetic field from the recording track is sensed for performing reproducing operation. A one-peak type signal waveform as in the lower part of FIG. 3 is obtained. No distortion such as asymmetry in the upper and lower sides can be found in the reproduced signal. Finally, the thin film head is incorporated into the magnetic recording apparatus to investigate the performance of the apparatus.

Figure 11:
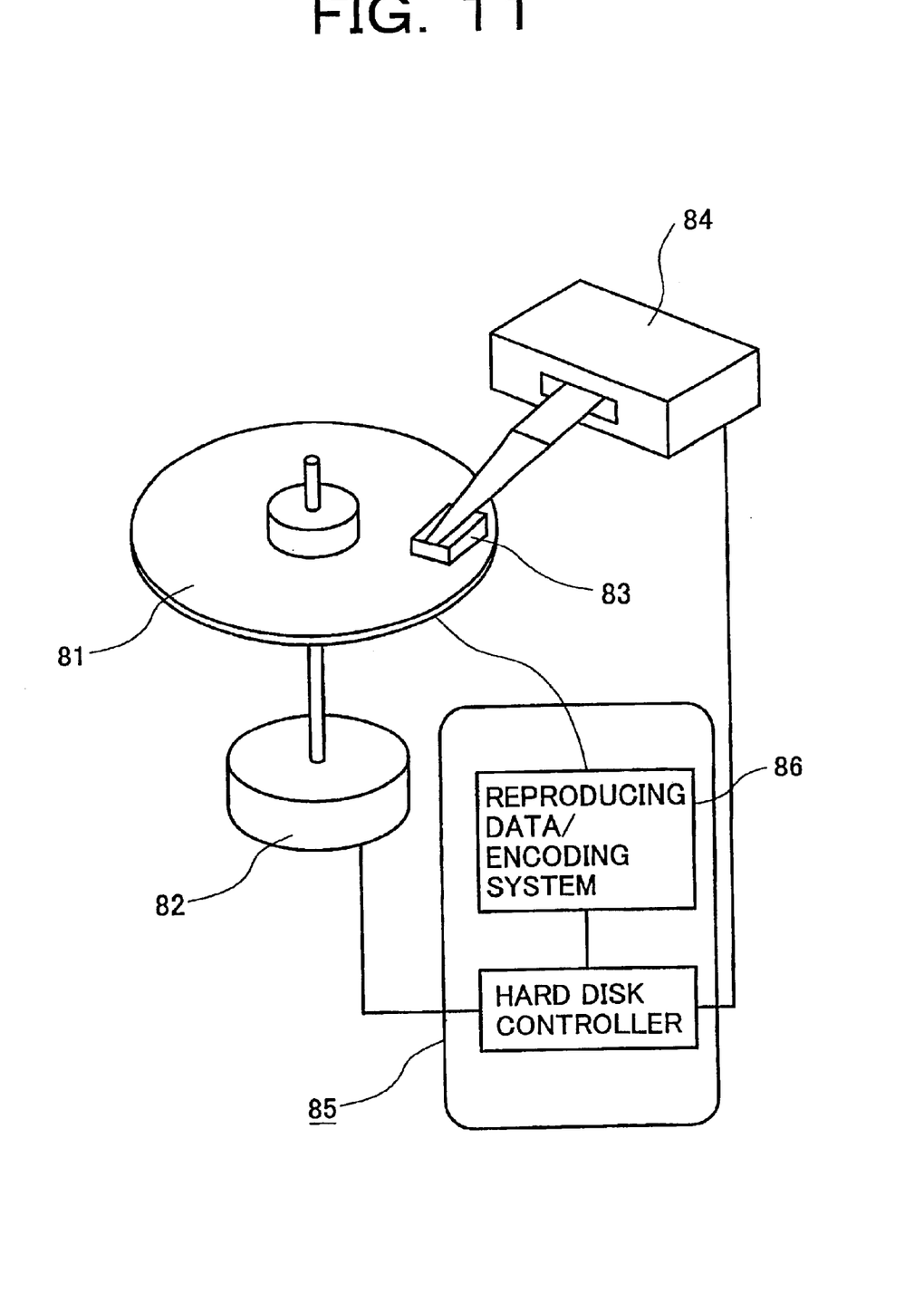
FIG. 11 is a schematic block diagram of a magnetic recording apparatus.

FIG. 11 shows a schematic diagram of the magnetic recording apparatus embodying the present invention. The interface to the exterior of the apparatus and the encoding processing system are omitted. A slider 83 forming the head is closed-loop controlled through a data reproducing/encoding system and head disk controller 85 and a positioning mechanism 84 to do seeks in a predetermined position on a magnetic disk 81 rotated at high speed by a spindle motor 82, thereby recording/reproducing desired information. In this embodiment, an MEE PRML system and error correction codes as in the longitudinal recording system are used as a reproduced signal processing system to record and reproduce information at a linear recording density of 930 kBPI and at a track density of 108 kTPI (a surface recording density of 100.4 Gb/in$^2$). A bit error rate of $10^{-7}$ is obtained. It is found that the sufficient performance as the magnetic recording apparatus can be exhibited.

[Embodiment 2]

Figure 12:
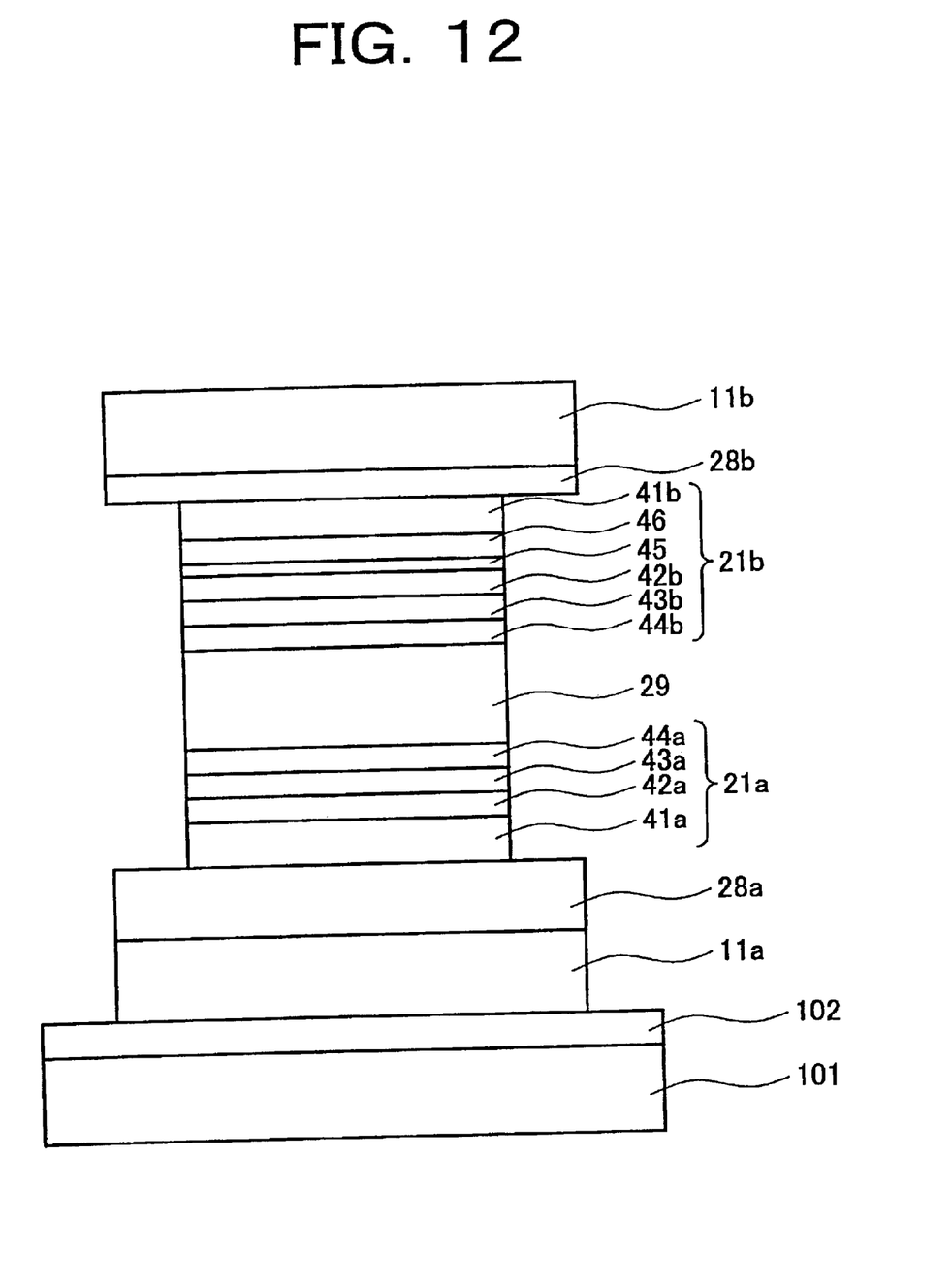
FIG. 12 is a schematic cross-sectional view of a reproducing sensor used in a second embodiment of the present invention.
Figure 13:
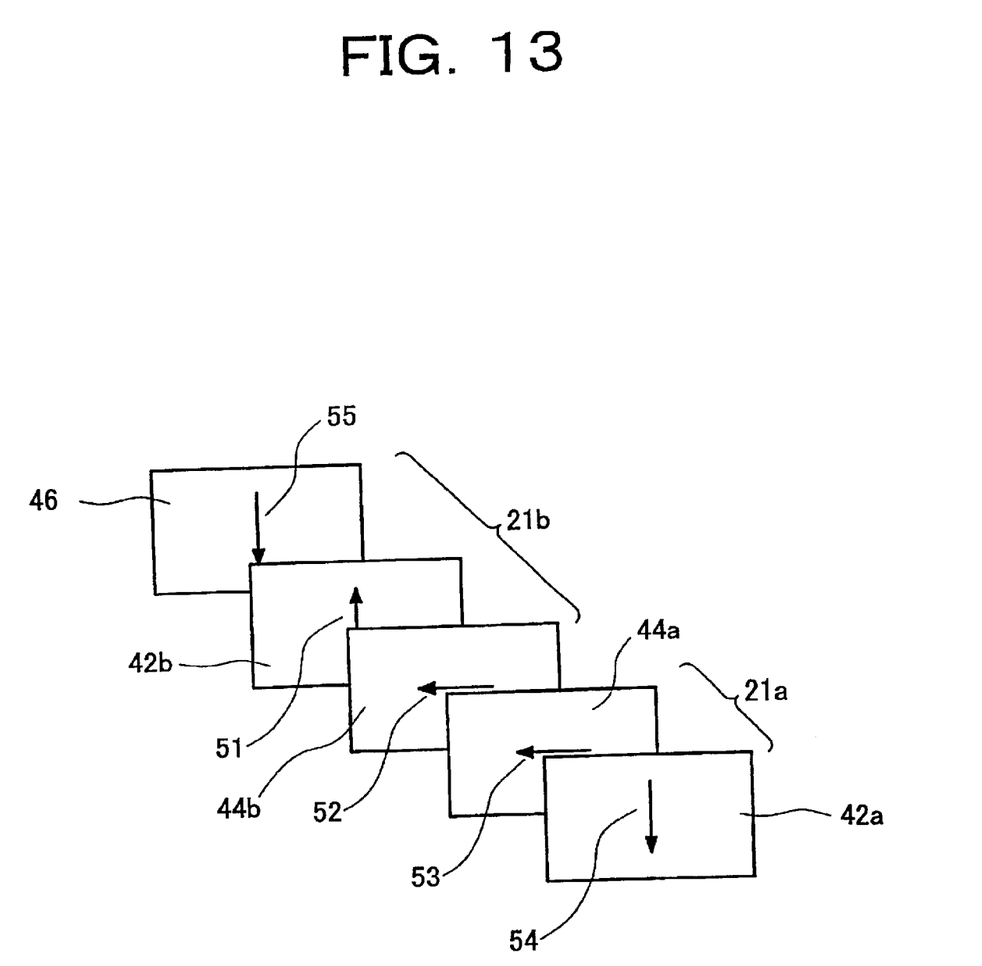
FIG. 13 is a magnetization state diagram of the respective ferromagnetic layers in the reproducing sensor used in the second embodiment of the present invention.

FIG. 12 shows a cross-sectional view of a reproducing sensor of a second embodiment of the present invention. The second embodiment is different from the first embodiment (FIG. 7) in that the non-magnetic metal film 45 of Ru (0.8 nm) and the ferromagnetic layer 46 of Co90Fe10 (1.5 nm) are inserted between the ferromagnetic layer 42b and the antiferromagnetic layer 41b, and the antiferromagnetic layer 41b of MnPt (12 nm) as in the antiferromagnetic layer 41a is used. The fixing layer of the MR element 21b is of a three-layer construction of the ferromagnetic material thin film/non-magnetic metal film/ferromagnetic material thin film. The respective ferromagnetic material thin films are interlayer-connected antiferromagnetically so that the magnetization directions are antiparallel with each other. In this embodiment, the heat treatment in the magnetic field to desirably arrange the magnetization of the fixing layer is conducted under the conditions of magnetic field: 10 kOe (one direction only), temperature: 250° C., and time: three hours. The heat treatment generates induced magnetic anisotropy in the same direction between the ferromagnetic layer 42a and the antiferromagnetic layer 41a, or between the ferromagnetic material thin film 46b and the antiferromagnetic layer 41b. As shown in FIG. 13, the magnetizations 54 and 55 are fixed in the same direction. In the MR element 21b, the ferromagnetic layer 42b is in a magnetization state to be in antiparallel with the ferromagnetic layer 46b, as described above. The magnetization arrangement from the ferromagnetic layer 42b to the ferromagnetic layer 42a is the same as the magnetization arrangement of the first embodiment shown in FIG. 8. The reading sensor can thus be expected to have the same property. Actually, the output of the reading sensor of this embodiment is 1.6 mV under the same conditions as in the first embodiment, and is found to be almost the same property. In this embodiment, there are no operation to reverse the magnetic field and holding time at different temperatures. The easier producing process can be done in a short time. The reading sensor can be obtained at lower cost.

Ru (0.8 nm) of the non-magnetic metal film of this embodiment is replaced by Rh (0.5 nm) or Ir (1.0 nm). The reproducing sensor can obtain the same property.

According to the present invention, in particular, magnetic recording having a high density exceeding 100 Gb/in$^2$ is possible. The magnetic recording apparatus can easily be small, have large capacity, and is inexpensive by reducing the number of the disks.

What is claimed is:

1. A reproducing sensor comprising:
   a multi-layer construction having:
   a first MR element comprising a first ferromagnetic layer (pin), a second ferromagnetic layer (free) and a non-magnetic insulting layer formed between the first ferromagnetic layer and the second ferromagnetic layer, a second MR element comprising a third ferromagnetic layer (free), a fourth ferromagnetic layer (pin) and non-magnetic insulting layer formed between the third ferromagnetic layer and the fourth ferromagnetic layer, and a non-magnetic conductive layer formed between the second ferromagnetic layer (free) and the third ferromagnetic layer (free), wherein a resistance of the first MR element and the second MR element is changed reversely from the magnetic field in the same direction, and magnetization directions of the first ferromagnetic layer and the fourth ferromagnetic layer are arranged antiparallel with each other;

a pair of electrodes for flowing an electric current in the direction perpendicular to the film surface of the multi-layer construction; and a pair of shields inserting the multi-layer construction, wherein the first MR element and the second MR element are electrically connected in series through the non-magnetic conductive layer by passing current between the pair of electrodes, and are patterned together with almost the same width, and wherein magnetization directions of the second ferromagnetic layer and the third ferromagnetic layer are arranged in parallel with each other.

2. The reproducing sensor according to claim 1, wherein a medium opposed surface of the pair of shields and a medium opposed surface of the multi-layer construction hold a same surface.

3. The reproducing sensor according to claim 1, wherein the first MR element comprises a first antiferromagnetic layer for fixing the magnetization direction of the first ferromagnetic layer, wherein the second MR element comprises a second antiferromagnetic layer for fixing the magnetization direction of the fourth ferromagnetic layer.

4. The reproducing sensor according to claim 1, wherein the first MR element and the second MR element are prevented from being shifted in the track width direction.

5. The reproducing sensor according to claim 1, wherein electric resistances of said MR elements changes during a reproducing operation, one of the electric resistances is increased to a medium magnetic field in the same direction, and the other is decreased thereto.

6. The reproducing sensor according to claim 1, wherein at least one of the first ferromagnetic layer and the fourth ferromagnetic layer is of a three-layer construction of ferromagnetic material thin film/non-magnetic metal thin film/ferromagnetic material thin film, and magnetizations of the ferromagnetic material thin film forming both ends of the three-layer construction are coupled so as to be arranged in antiparallel with each other.

7. The reproducing sensor according to claim 6, wherein the non-magnetic metal thin film in said at least one of the first ferromagnetic layer and the fourth ferromagnetic layer in said pair of magnetoresistive layers is any one of Ru, Rh and Ir.

8. The reproducing sensor according to claim 1, wherein at least one of the ferromagnetic layers of said MR elements reverses a fixing direction of magnetization thereof by applying a predetermined magnetic field.

9. The reproducing sensor according to claim 1, wherein said MR elements include at least one spin tunnel junction.

10. The reproducing sensor according to claim 9, wherein the non-magnetic insulating layers in said MR elements are made of oxide aluminum.

* * * * *